(12) United States Patent
Gubenko et al.

(10) Patent No.: US 9,350,138 B2
(45) Date of Patent: May 24, 2016

(54) SINGLE-STEP-GROWN TRANSVERSELY COUPLED DISTRIBUTED FEEDBACK LASER

(71) Applicant: Innolume GmbH, Dortmund (DE)

(72) Inventors: Alexey Gubenko, Dortmund (DE); Daniil Livshits, Dortmund (DE); Sergey Mikhrin, Dortmund (DE); Igor Krestnikov, Dortmund (DE)

(73) Assignee: Innolume GmbH, Dortmund (DE)

( * ) Notice: Subject to any disclaimer, the term of this patent is extended or adjusted under 35 U.S.C. 154(b) by 83 days.

(21) Appl. No.: 14/182,335

(22) Filed: Feb. 18, 2014

(65) Prior Publication Data

US 2015/0280402 A1 Oct. 1, 2015

(51) Int. Cl.
*H01S 5/00* (2006.01)
*H01S 5/125* (2006.01)
*H01S 5/22* (2006.01)
(Continued)

(52) U.S. Cl.
CPC ............... *H01S 5/125* (2013.01); *H01S 5/0202* (2013.01); *H01S 5/12* (2013.01); *H01S 5/187* (2013.01); *H01S 5/22* (2013.01); *H01S 5/221* (2013.01); *H01S 5/2215* (2013.01); *H01S 5/34313* (2013.01); *H01S 5/026* (2013.01); *H01S 5/06256* (2013.01); *H01S 5/1085* (2013.01); *H01S 5/124* (2013.01); *H01S 5/1221* (2013.01); *H01S 5/1246* (2013.01); *H01S 5/3054* (2013.01)

(58) Field of Classification Search
CPC ....... H01S 5/125; H01S 5/221; H01S 5/0202; H01S 5/34313; H01S 5/12; H01S 5/2215; H01S 5/22; H01S 5/187; H01S 5/06256; H01S 5/124; H01S 5/1246; H01S 5/3054; H01S 5/1221; H01S 5/1085; H01S 5/026
See application file for complete search history.

(56) References Cited

U.S. PATENT DOCUMENTS 4,722,092 A 1/1988 Liau et al.
5,960,018 A 9/1999 Jewell et al.
(Continued)

FOREIGN PATENT DOCUMENTS

WO 2012058742 A1 5/2012

OTHER PUBLICATIONS

Nakahara, K. et al.; "40-Gb/s Direct Modulation With High Extinction Ratio Operation of 1.3-um InGaAlAs Multiquantum Well Ridge Waveguide Distributed Feedback Lasers"; IEEE Photonics Technology Letters; Oct. 1, 2007; vol. 19(19), pp. 1436-1438.

(Continued)

*Primary Examiner* — Yuanda Zhang
(74) *Attorney, Agent, or Firm* — Brown & Michaels, PC

(57) ABSTRACT

A transversely-coupled distributed feedback laser diode, which can be processed without overgrowth, is disclosed. The laser is made from an epitaxial heterostructure including a core layer located between two cladding layers, a cap layer, and at least one Al-rich layer. The lateral waveguide is formed by selective oxidation of the Al-rich layer. A surface corrugated grating is formed above the waveguide. The heteroepitaxial structure is designed so that the core layer is placed in close proximity to the top of the laser structure to provide a required overlap between the light and the grating. In order to avoid inadmissible optical losses, there is no metallization above the waveguide. Instead, the metal contacts are offset at some distance, so that the current has to spread in the cap layer before vertical injection into the core layer.

32 Claims, 9 Drawing Sheets

(51) Int. Cl.
*H01S 5/12* (2006.01)
*H01S 5/187* (2006.01)
*H01S 5/02* (2006.01)
*H01S 5/343* (2006.01)
*H01S 5/026* (2006.01)
*H01S 5/0625* (2006.01)
*H01S 5/10* (2006.01)
*H01S 5/30* (2006.01)

(56) References Cited

U.S. PATENT DOCUMENTS

| | | | |
|---|---|---|---|
| 5,982,804 A | 11/1999 | Chen et al. | |
| 6,638,773 B1* | 10/2003 | Hwang | H01S 5/1082 438/2 |
| 2002/0048300 A1* | 4/2002 | Tsukiji | H01S 5/227 372/50.11 |
| 2005/0053112 A1* | 3/2005 | Shams-Zadeh-Amiri | H01S 5/187 372/96 |
| 2005/0078728 A1* | 4/2005 | Evans | H01S 5/42 372/50.1 |
| 2009/0097522 A1 | 4/2009 | Justice et al. | |
| 2012/0106583 A1* | 5/2012 | Watson | H01S 5/1231 372/46.012 |
| 2013/0016942 A1* | 1/2013 | Gubenko | G02B 6/1228 385/14 |

OTHER PUBLICATIONS

Jang, S. et al; "Laterally Coupled DFB Lasers With Self-Aligned Metal Surface Grating by Holographic Lithography"; IEEE Photonics Technology Letters, Apr. 1, 2008; vol. 20 (7), pp. 514-516.
Govind P. Agrawal et al.; "Semiconductor Lasers"; Van Nostrand Reinhold, New York; 1993; pp. 181-212, 321-323.
Oishi, M. et al; "MOVPE-Grown 1.5 um Distributed Feedback Lasers on Corrugated InP Substrates"; IEEE Journal of Quantum Electronics, Jun. 1987; vol. QE-23(6); pp. 822-827.
Miller, L.M. et al; "A Distributed Feedback Ridge Waveguide Quantum Well Heterostructure Laser"; IEEE Photonics Technology Letters; Jan. 1991; vol. 3(1); pp. 6-8.
Martin, R.D. et al; "CW Performance of an InGaAs—GaAs—AlGaAs Laterally-Coupled Distributed Feedback (LC-DFB) Ridge Laser Diode"; IEEE Photonics Technology Letters; Mar. 1995; vol. 7(3); pp. 244-246.
Otsubo, K. et al; "1.3-um AlGaInAs Multiple-Quantum-Well Semi-insulating Buried-Heterostructure Distributed-Feedback Lasers for High-Speed Direct Modulation"; IEEE Journal of Selected Topics in Quantum Electronics; May/Jun. 2009; vol. 15(3); pp. 687-693.
Miller, L.M. et al; "Characterization of an InGaAs—GaAs—AlGaAs Strained-Layer Distributed-Feedback Ridge-Waveguide Quantum-Well Heterostructure Laser"; IEEE Photonics Technology Letters; Apr. 1992; vol. 4(4); pp. 296-299.
Temkin, H. et al; "1.55um InGaAsP ridge waveguide distributed feedback laser"; Applied Physics Letters; 1984; 45(11); pp. 1178-1180.
Gollub, D. et al; "1.3 um continuous-wave GaInNAs/GaAs distributed feedback laser diodes"; Applied Physics Letters; Dec. 2002; vol. 81(23); pp. 4330-4331.
Chen, T.R. et al; "Very high power InGaAsP/InP distributed feedback lasers at 1550 nm wavelength"; Applied Physics Letters; Mar. 1998; vol. 72(11); pp. 1269-1271.
Kamp, M. et al; "Low-threshold high-quantum-efficiency laterally gain-coupled InGaAs/AlGaAs distributed feedback lasers"; Applied Physics Letters; Jan. 1999; vol. 74(4); pp. 483-485.
Krebs, R. et al; "High frequency characteristics of InAs/GaInAs quantum dot distributed feedback lasers emitting at 1.3 um"; Electronics Letters; Sep. 27, 2001; vol. 37(20); pp. 1223-1225.
Gollub, D. et al; "GaInNAs-based distributed feedback laser diodes emitting at 1.5um"; Electronics Letters; Apr. 1, 2004; vol. 40(7); 2 pages.
Forouhar, S. et al; "High-power laterally coupled distributed-feedback GaSb-based diode lasers at 2um wavelength"; Applied Physics Letters; 2012; 100, 031107; pp. 031107-1 to 031107-4.
Naehle, S. et al; "Continuous-wave operation of type-I quantum well DFB laser diodes emitting in 3.4 um wavelength range around room temperature"; Electronics Letters; Jan. 6, 2011; vol. 47(1); 2 pages.
Otsubo, K. et al; "Uncooled 25 Gbit/s direct modulation of semi-insulating buried-heterostructure 1.3 um AlGaInAs quantum-well DFB lasers"; Electronics Letters; May 8, 2008; vol. 44(10); 2 pages.
Wong, v. et al; "Ridge-waveguide sidewall-grating distributed feedback structures fabricated by x-ray lithography"; Journal of Vacuum Science and Technology B; 1993; vol. 11(6); pp. 2621-2624.
International PCT Search Report for PCT/EP2014/053092; May 21, 2014; 11 pages.
Distributed Feedback Lasers Overview, http://www.slidefinder.net/d/distributed_feedback_lasers_overview_mike/dfb/6872239, Jan. 11, 2010.
Quantum-dot lasers provide high performance near 1.15 microns, Johannes Koth, SPIE, Sep. 22, 2008, https://spie.org/x27589.xml.
http://ecee.colorado.edu/~bart/ecen6355/chapt-02.pdf, Principles of Electronic Devices, Bart J. Van Zeghbroeck 1996.

* cited by examiner

A

B

A

B

SINGLE-STEP-GROWN TRANSVERSELY COUPLED DISTRIBUTED FEEDBACK LASER

REFERENCE TO RELATED APPLICATIONS

This application claims one or more inventions which were disclosed in Provisional Application No. 61/765,936, filed Feb. 18, 2013, entitled "SINGLE-STEP-GROWN TRANSVERSELY COUPLED DISTRIBUTED FEEDBACK LASER". The benefit under 35 USC §119(e) of the United States provisional application is hereby claimed, and the aforementioned application is hereby incorporated herein by reference.

BACKGROUND OF THE INVENTION

1. Field of the Invention

The invention relates to single-frequency lasers, specifically, to monolithic laser diodes including at least one distributed Bragg reflector (DBR), and more specifically, to distributed feedback (DFB) laser diodes. The invention also relates to the selective oxidation of Al-rich III-V layers, specifically for laterally oxidized ridge lasers.

2. Description of Related Art

Distributed feedback (DFB) laser diodes are monolithic, compact, power-efficient and low-cost sources of coherent light. The lasers are capable of emitting a single narrow low-noise spectral line, which can be smoothly tuned by either carrier injection or temperature without hopping. Moreover, if properly constructed, the devices can be directly modulated with the frequencies up to few tens GHz and remain in single-line operation. Owing to these features, DFB lasers are applied in various areas including, but not limited to, communications, solid-state laser pumping, and spectroscopy.

Like a simple Fabri-Perot laser diode, the construction of a DFB laser diode includes (see, for example, G. P. Agrawal and N. K. Dutta, "Semiconductor Lasers", Van Nostrand Reinhold, 1993, pp. 181-212, 321-323) a semiconductor heterostructure, which is designed for confinement of both photons and charge carriers in the vertical direction. In order to confine photons, the heterostructure includes an optical waveguide ordinarily supporting only one fundamental mode. The waveguide includes a core surrounded by claddings having smaller refractive indexes compared to the core index. The core includes an active region usually consisting of one or a few quantum-wells and providing a separate carrier confinement. Being pumped over the transparency level, the active region operates as a gain medium for the guided light. The cladding layers are doped oppositely, by donors and acceptors, while the core normally remains undoped, so that a p-i-n junction is formed. When the p-i-n junction is biased in the forward direction, electrons and holes are injected into the active region, thereby providing an inverse population of energy states. Ohmic metallic contacts are formed from the top and bottom sides of the heterostructure and allow the application of current, as well as mounting the laser diode on a holder and wiring.

DFB lasers can be broad area, e.g. for pumping, or include also a lateral confinement, e.g. for communications. A vast majority of commercial DFB lasers with lateral confinement are index-guided and use buried heterostructures for strong index-guiding or ridge waveguides for weak index-guiding. Typically, buried heterostructure lasers have better performance in terms of the threshold current, the slope efficiency and the modulation rate, mainly because they have a narrow stripe and are not affected by lateral carrier diffusion. Therefore, these lasers are used in communications. However, the buried heterostructure type waveguides are complicated and, therefore, more critical to the fabrication process. They require at least one overgrowth step that results in higher cost of manufacturing and lower yield. Ridge waveguide designs are simpler and more tolerant of the fabrication process. They allow control of a lateral index step on a post-growth stage of laser processing and can be realized without the overgrowth.

The distinguishing feature of the DFB lasers as compared to other laser diodes is a presence of the integrated periodical Bragg grating structure. Being placed close to or inside the waveguide core, the grating couples counter-propagating optical waves having the wavelength within the grating stopband, i.e. in a certain vicinity of the Bragg wavelength $\lambda_{B,m} = 2 n_e \Lambda/m$, where $n_e$ is the mode effective refractive index, $\Lambda$ is the grating period, and m is a natural number defining the diffraction order for back reflected radiation. Such a grating works as a spectrally selective distributed mirror and is capable of providing an optical feedback for laser generation. In order to reach the generation state, the grating period is selected such that the optical gain at the Bragg wavelength is positive at a certain pumping level and covers summary optical loss.

The Bragg grating of a conventional DFB laser is embedded into the optical waveguide cladding either above the core (see, for example, T. R. Chen et al., "Very high power InGaAsP/InP distributed feedback lasers at 1550 nm wavelength," Appl. Phys. Lett., vol. 72, pp. 1269-1271, 1998; K. Nakahara et al., "40-Gb/s direct modulation with high extinction ratio operation of 1.3-μm InGaAlAs multiquantum well ridge waveguide distributed feedback lasers," IEEE Photon. Technol. Lett., vol. 19, pp. 1436-1438, 2007), or below the core (M. Oishi et al., "MOVPE-grown 1.5 μm distributed feedback lasers on corrugated InP substrates". IEEE J. Quantum. Electron., QE-23, pp. 822-827, 1987; K. Otsubo et al., "1.3-μm AlGaInAs Multiple-Quantum-Well Semi-insulating Buried-Heterostructure Distributed-Feedback Lasers for High-Speed Direct Modulation," IEEE J. Sel. Top. Quantum Electron., vol. 15, pp. 687-693, 2009) that provides vertical or, in other words, transverse coupling geometry. Advantages of the transverse coupling geometry are the large coupling strength possibility, the precise control of the overlap between the grating and the optical mode, and only a slight dependence of the coupling coefficient on the lateral waveguide shape and width. The possibility of large coupling strength is applicable to low-threshold DFB lasers having short cavities and also favors a higher side mode suppression ratio. The precise control of the overlap between the grating and the optical mode relates to a better reproducibility of laser characteristics. The slight dependence of the coupling coefficient on the lateral waveguide shape and width allows using either narrow or non-narrow waveguides, which is critical for high-power DFB lasers. However, a serious disadvantage of the deep grating incorporation into the heterostructure is a strong necessity of at least one regrowth step over the grating formed on the surface of the epitaxial heterostructure. The regrowth step considerably complicates the device fabrication process and ultimately increases costs. The qualitative regrowth is especially difficult in Al-containing material systems, e.g. AlGaAs/GaAs and AlGaAsSb/GaSb.

Laterally coupled DFB (LC-DFB) lasers, first demonstrated by L. M. Miller (L. M. Miller et al., "A distributed feedback ridge waveguide quantum well heterostructure laser," IEEE Photon. Technol. Lett., vol. 3, pp. 6-8, 1991), avoid problems induced by the overgrowth. The grating of the LC-DFB lasers is created on a structure surface in close proximity to the ridge or patterned onto the side walls, whereas the current flows in the vertical direction. Since there is no need for carrier flow through the grating, the lasers can be manufactured with a single-step growth. The LC-DFB lasers can be either index-coupled (see, for example, L. M. Miller et al., "A distributed feedback ridge waveguide quantum well heterostructure laser," IEEE Photon. Technol. Lett., vol. 3, pp. 6-8, 1991; R. D. Martin et al., "CW performance of an InGaAs—GaAs—AlGaAs laterally-coupled distributed feedback (LC-DFB) ridge laser diode," IEEE Photon. Technol. Lett., vol. 7, pp. 244-246, 1995) or gain (loss)-coupled. The gain (loss)-coupled lasers exploit a periodically modulated imaginary part of the refractive index instead of the real part. One way to fabricate such a laser utilizes a metal-stripe grating instead of the surface corrugated grating (see, for example, S. J. Jang et al., "Laterally coupled DFB lasers with self-aligned metal surface grating by holographic lithography", IEEE Photon. Technol. Lett., vol. 20, pp. 514-516, 2008). As the pure gain (loss) coupling is not so simple to reach, a more correct name is complex-coupled. The LC-DFB lasers based on complex coupling do not suffer from longitudinal mode degeneration, so that there is no need in $\lambda/4$ phase shift or modulated stripe width to guarantee stable single-longitudinal mode lasing, and these lasers are less sensitive to the optical feedback. However, since there is an inherent loss mechanism, they demonstrate less power efficiency compared to the index-coupled lasers. Both index-coupled and complex-coupled LC-DFB lasers have low overlap of the grating with the optical field that limits the upper achievable value of the coupling coefficient. Another drawback is the complicated post-growth processing procedure, which requires either deep grating etching before forming the ridge or precise lithography on a nonplanar surface after forming the ridge. The former is extremely difficult for the first-order gratings. In the case of the latter, the coupling coefficient strongly depends on the mesa depth and shape, e.g. mesa walls tilt and footing, which have to be accurately controlled.

Thus, all of the prior art DFB lasers suffer from at least one of the following drawbacks: multi-step structure growth, the complicated and precise post-growth technology need, a low grating coupling coefficient, and low power efficiency.

All of the above-mentioned references are hereby incorporated by reference herein.

SUMMARY OF THE INVENTION

A transversely coupled distributed feedback laser diode, which can be processed without overgrowth, is disclosed.

The epitaxial heterostructure, of which the laser is made, includes a core layer placed between two cladding layers or structures, a highly doped cap layer, and at least one layer with high aluminum content (an Al-rich layer). The ridge is formed in the heterostructure so that the Al-rich layer is open along the side walls of the ridge. An oxide stripe is created by selective oxidation of the Al-rich layer from the side walls. The stripe provides both a lateral confinement for laser radiation and an aperture for electrical current. A surface-corrugated Bragg grating covers at least some area above the stripe. The heterostructure is designed such that the Bragg grating is placed in close proximity to the transverse waveguide core in order to achieve required interaction strength between the grating and the light propagating in the waveguide. In order to avoid inadmissible light absorption, there is no metallization above the stripe. Instead, metal contacts are laterally offset by some distance. The oxidized part of the Al-rich layer blocks the transverse current below the contacts, so that charge carriers spread laterally within the cap and upper cladding layers, then vertically inject into the core layer in the area limited by the part of the Al-rich layer that is not oxidized.

The construction of the distributed feedback laser allows a simple fabrication procedure, which avoids the complex and delicate operation of epitaxial overgrowth, which is typically used for the manufacturing of distributed feedback lasers. This improves the yield of the lasers and allows the use of some material systems, which are known to be problematic for overgrowth, e.g. AlGaAs systems. Compared to some constructions of overgrowth-free lasers known as laterally-coupled distributed feedback (LC-DFB) lasers, the lasers described herein have the advantages of a larger value of a coupling coefficient, precise control of the coupling coefficient, a more flexible lateral waveguide design, and a higher output power due to the use of a broader waveguide.

DETAILED DESCRIPTION OF THE INVENTION

An essential advantage of the distributed feedback lasers described herein over conventional distributed feedback lasers is overgrowth-free manufacturing, which avoids difficulties related to the low quality of the interface between the grating and the overgrown material. This is especially important for AlGaAs systems suffering from the affinity to oxygen.

In contrast to overgrowth-free lasers of another type, known as laterally-coupled distributed feedback (LC-DFB) lasers, the lasers disclosed herein exploit transverse coupling. This avoids many inherent problems of LC-DFB lasers. The transverse coupling is more easily and more accurately controlled, because its strength is well defined by the epitaxial heterostructure and the grating manufacturing process. In contrast to LC-DFB lasers, the grating coupling coefficient only slightly depends on the ridge width, the shape of walls, or the footing presence at the ridge base. Consequently, an extra degree of freedom exists for waveguide design. Particularly, the result is higher output light power, which is achieved by using a wider lateral waveguide without affecting the coupling coefficient. Another advantage of the distributed feedback lasers disclosed herein is that these lasers easily provide strong interaction between the light and the grating, which is important for high-speed distributed feedback lasers.

The distributed feedback lasers described herein preferably have the following distinctive features. First, a Bragg grating is located on the top surface of the epitaxial structure above the optical waveguide, and, therefore, can be manufactured without overgrowth. Such a combination of the transverse coupling geometry with the single step epitaxial process provides a number of advantages in terms of the device performance and manufacturability. Second, there is no metal contact above the optical waveguide mode, thus avoiding inadmissible optical losses, keeping both the technologically acceptable grating tooth height and a sufficiently high coupling coefficient. Since optical losses appear as a result of the strong absorption of the photons tunnelled through the upper cladding by metal, the contacts are located at some distance from the lateral waveguide edge. The grating is formed in a heavily-doped cap layer such that the grating teeth in the cap layer are used for current-spreading instead of using a metal layer. Third, the selective oxidation of the Al-rich layers is used to form a lateral optical waveguide, to provide proper distance between the metallic contacts and the optical mode, and to direct the pumping current into the optical mode region.

"Al-rich" layers, as defined herein, are aluminum containing layers with a high aluminum composition ("rich in Al"). The "high aluminum composition" means sufficiently high to be transformed to $(AlGa)_xO_y$ by oxidation. In examples described here, the Al composition in Al-rich layers is preferably greater than or equal to 80%.

Figure 1:
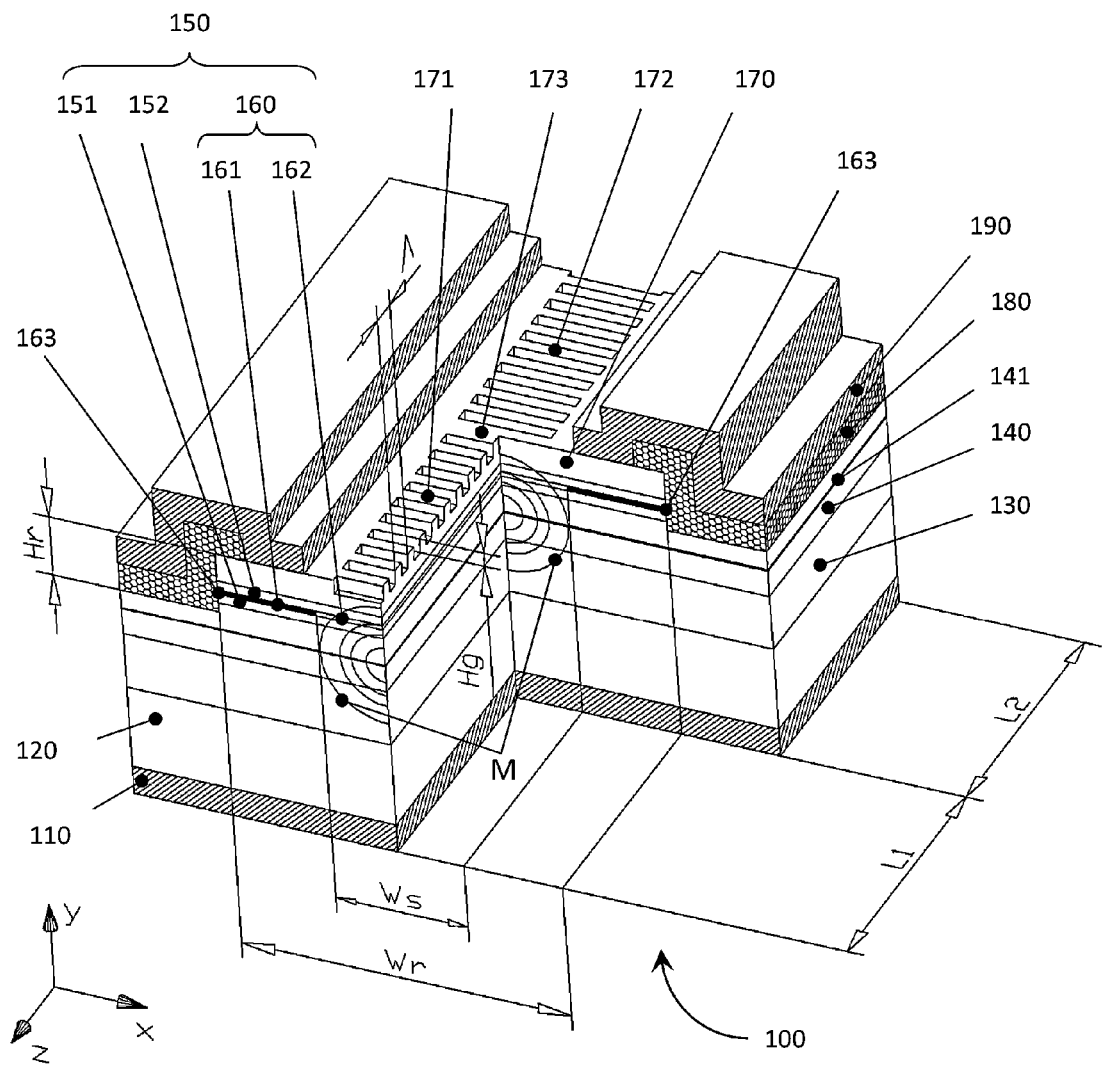
FIG. 1 is a partial cut away perspective view of a first embodiment of the distributed feedback laser.

FIG. 1 shows a cross-sectional perspective view of a first embodiment of a distributed feedback laser in accordance with the present invention. The lateral, transverse (or vertical), and longitudinal directions are marked as x, y, and z correspondingly. In order to simplify understanding, the same spatial coordinate system and notations are used in all of the figures. The laser 100 is manufactured from a semiconductor layered structure including a substrate 120, a core structure 140 sandwiched between one or more lower cladding layers 130, and an upper cladding structure 150. The upper cladding structure 150 includes at least one Al-rich layer 160 and, optionally, at least one spacer layer 151, 152. The core 140 is made from semiconductor materials having narrower bandgaps and larger refractive indices compared to those of the cladding layers 130, 150 for transverse localization of charge carriers and light. The lower and the upper cladding layers are doped oppositely so that a p-n junction is formed. For definiteness, in preferred embodiments, it is assumed that the upper cladding structure 150 is doped with acceptors, and the lower cladding layer 130 is doped with donors. The core structure 140 is preferably undoped in order to minimize optical losses. The core structure 140 includes an active region 141, capable of providing a positive optical gain under a certain level of injection of charge carriers. In the embodiment shown in FIG. 1, the active region 141 consists of a single quantum well. In other embodiments, the active region 141 can include any combination of bulk or quantum-confined layers including quantum wells, quantum wires, and quantum dots. Distinctive features of the laser structure include the presence of one or more Al-rich layers 160, and a decreased thickness of the upper cladding structure 150 compared to similar structures in prior-art lasers. In a preferred embodiment, the thickness of the upper cladding structure 150 is small enough to provide the required interaction strength of the waveguide mode M with the corrugated distributed Bragg gratings (DBR) 171 and 172, which are formed on the surface of the structure. The combination of the thicknesses and compositions of the spacer layers 151, 152 and the thickness of the Al-rich layer 160 are selected such that the desirable overlap of the optical mode with the distributed Bragg reflectors and the desirable lateral waveguide strength are obtained. The total thickness of the upper cladding structure 150 depends on the target laser characteristics and is preferably selected within the range of 20-500 nm. The total structure defines the mode profile, and the grating coupling factor. If there are multiple Al-rich layers 160, the combination of Al-rich layers is similarly chosen to obtain the desirable overlap of the optical mode with the distributed Bragg reflectors and the desirable effective index step for the lateral optical waveguide. In some preferred embodiments, the Al-rich layer 160 thickness (or in embodiments with multiple Al-rich layers, the total thickness of the Al-rich layers) is preferably not less than 20 nm and not greater than 200 nm.

A ridge is etched from the top surface of the heterostructure. The ridge height $H_r$ and width $W_r$ are shown in FIG. 1. The ridge length L is the total length of the chip, equals L1+L2(L=L1+L2). The ridge height $H_r$ is selected such that the side walls 163 of the Al-rich layer 160 are opened for the selective oxidation process. The Al-rich layer 160 is partially oxidized. The oxidized part 161 of the Al-rich layer is shown in black, and the non-oxidized part 162 is shown as white. The partial oxidation of the Al-rich layer 160 creates an aperture 162 for current flow (also shown in FIG. 4) and simultaneously forms a lateral waveguide for laser radiation. The ridge width $W_r$ is preferably selected to be narrow enough to minimize the oxidation depth $(W_r-W_s)/2$, where $W_s$ is the lateral waveguide width. This reduces both the roughness of the lateral waveguide edges and the device electrical capacitance. On the other hand, the ridge should be broad enough to avoid unacceptable light absorption by the metal contacts 190, as well as to keep lithography tolerances relaxed. A dielectric layer 180 is deposited to block the transverse current everywhere except for the ridge. Metal contacts 190 are formed on the top surface of the ridge at a sufficient distance from the waveguide mode, to prevent loss due to absorption of the light by the metal. The distance is selected to be large enough so that the metal-induced optical losses are low compared to summary losses, but not too large to avoid unnecessary electrical resistance and heating. In some preferred embodiments the metal edges are offset at a distance of approximately 0.5 to approximately 5 μm from the oxide stripe edges. The oxidized part 161 of the Al-rich layer 160 electrically isolates the structure below the contacts so that the current mainly passes in the cap layer 170 along the distributed Bragg reflector teeth and, optionally in the upper spacer layer 152, and then flows through the aperture 162, which is the non-oxidized portion of the Al-rich layer 160. As a result, the pumped region significantly overlaps with the optical waveguide mode. The bottom metal contact 110 preferably covers the whole bottom surface of the n-doped substrate 120.

The longitudinal laser construction is similar to that of typical distributed feedback lasers. The illustrated device includes two first-order distributed Bragg reflector sections 171, 172 with the same period (pitch) $\Lambda = \lambda_B/(2 n_e)$, where $\lambda_B$ is a free-space fundamental Bragg wavelength and $n_e$ is an effective refractive index of the waveguide mode M. The fundamental Bragg wavelength lies in a middle of the distributed Bragg reflector stop-band, wherein the resonance back reflection takes place. The cleaved facets have a deep antireflection (AR) coating. The duty cycle and the tooth heights are selected to be the same for both gratings, so that the mode coupling coefficients between two counter-propagating waves are equivalent. The $\lambda/4$ phase shift 173 between the distributed Bragg reflector sections provides stable single-frequency lasing at the Bragg wavelength $\lambda_B$. The distributed Bragg reflectors can be selected to be the same or different lengths. If the distributed Bragg reflectors sections have the same length, length L1=L2=L/2, where L is a total cavity length, then the device emits equal power from both sides. In some cases, the redirection of power to one of the laser sides is desirable. That can be obtained by using non-equivalent distributed Bragg reflector sections. In one particular embodiment, the length (L1) of the distributed Bragg reflector adjacent to the output facet can be chosen to be shorter than the other distributed Bragg reflector (L2) such that L1<L2.

In one example of a distributed feedback laser 100, the epitaxial wafer is grown in a single epitaxial process on a substrate 120 of GaAs by molecular beam epitaxy (MBE) or metal organic chemical vapor deposition (MOCVD). The wafer structure is shown in Table 1, which includes layer compositions, thicknesses, and theoretical refractive indexes. These parameters are used for simulation and are related to FIGS. 2-4. The core 140 includes one or a few InGaAs quantum wells 141 designed for operating at the wavelength $\lambda \approx 1.05$ μm.

TABLE 1

Layer structure of a DFB laser with refractive indices according to the first example.

| Layer Description | Composition | Layer Thickness (nm) | Refractive index |
|---|---|---|---|
| Substrate 120 | GaAs | — | 3.487 |
| Lower cladding 130 | $Al_{0.35}Ga_{0.65}As$ | — | 3.279 |
| Core 140 | $Al_{0.15}Ga_{0.85}As$ | 660 | 3.395 |
| Upper cladding structure 150 | | | |
| Lower spacer layer 151 | $Al_{0.35}Ga_{0.65}As$ | 25 | 3.279 |
| Al-rich layer 160 | $Al_{0.95}Ga_{0.05}As/$ $(AlGa)_xO_y$ | 40 | 2.965/1.6 |
| Upper spacer layer 152 | $Al_{0.35}Ga_{0.65}As$ | 25 | 3.279 |
| Cap layer 170 | GaAs | 155 | 3.487 |

Figure 2:
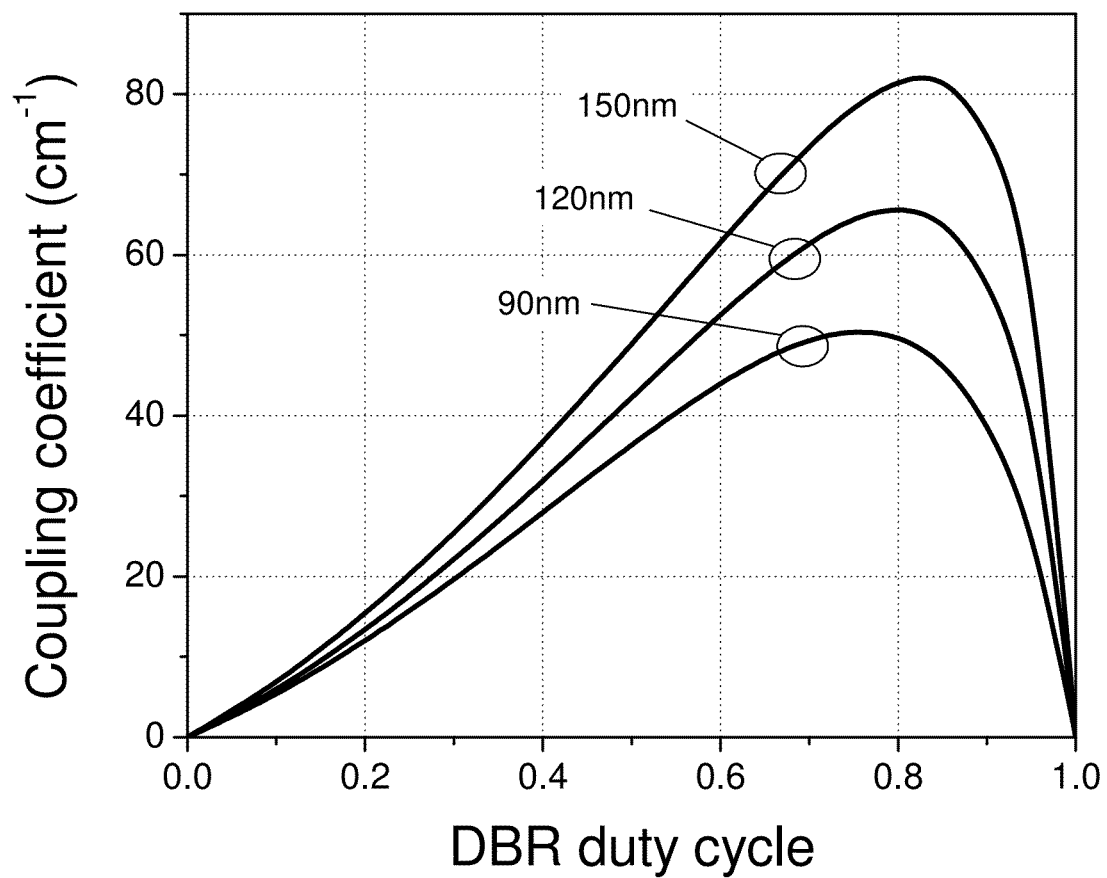
FIG. 2 is a simulated coupling coefficient between counter-propagating waves inside the laser cavity versus the DBR duty cycle and the DBR tooth height for the example structure of Table 1. In this approximation, only the transverse waveguide is taken into account. A first order distributed Bragg reflector with the rectangular tooth shape and the Bragg wavelength are assumed.

The distributed Bragg reflector is preferably etched in the GaAs contact layer so that the distributed Bragg reflector tooth height $H_g$ is less than the cap layer thickness. This allows more precise control of the distributed Bragg reflector teeth shape and size as well as helping to avoid a parasitic oxidation of AlGaAs, which can be opened by too deep etching of the distributed Bragg reflector. In one embodiment shown in the figures, the distributed Bragg reflector tooth shape is rectangular. For example, approximately rectangular teeth can be formed by reactive ion etching (RIE), which is a type of dry etching technique. In other embodiments, different grating profiles including, but not limited to, triangular, trapezoidal, other quadrilaterals, or more complex shapes are also possible, as well as other distributed Bragg reflector etching techniques including, but not limited to, either isotropic or anisotropic wet etching. In some embodiments having low Al content in the upper spacer layer 152 of the cladding structure 150, distributed Bragg reflector etching through the cap layer 170 into the upper spacer layer 152 is acceptable. In other words, in some embodiments, the distributed Bragg reflector may be etched into the cladding structure 150, but should not be etched to a depth that reaches the Al-rich layer. The grating tooth height $H_g$ and the cap layer 170 thickness are selected as a trade-off between ease of manufacturing and possibly lower sheet electrical resistance. The thickness of the lower spacer layer 151 and the thickness of the Al-rich layer(s) 160 are selected so that the laser operates in a fundamental mode at the lateral waveguide width w≈2-4 μm, which is typical for weak index-guided single spatial mode laser diodes. The thickness of the upper spacer layer 152 is selected so that the desirable value of the coupling factor κ between counterpropagating waves can be reached. The layer structure is designed for a distributed Bragg reflector coupling factor κ≈15-60 cm$^{-1}$ at a technologically reasonable distributed Bragg reflector duty cycle ζ≈0.3-0.7 (the fraction of the period occupied by a grating tooth) and a grating tooth height $H_g$≈120 nm. Thus, a practically useful κL product of ≈1.5 corresponds to the chip length L≈250-1000 μm. The calculated dependence of the distributed Bragg reflector coupling factor on the distributed Bragg reflector duty cycle is illustrated in FIG. 2. The curves correspond to three values of the grating tooth height $H_g$ of 90 nm, 120 nm, and 150 nm.

There is a trade-off between the internal optical loss and the electrical resistance of the distributed feedback laser in the embodiments described herein. On the one hand, the overlap of the optical field with the cap layer, which includes a corrugated distributed Bragg reflector, has to be large enough to obtain the required coupling coefficient. Consequently, too high a level of doping of the cap layer is undesirable in order to avoid unacceptably large optical loss. On the other hand, the cap layer must be sufficiently doped to provide enough conductivity for avoiding undesirable energy loss and heating, which affect the main laser parameters. The problem is enhanced by the specific design, which includes the need for carrier lateral spreading before injecting into the core.

Figure 3:
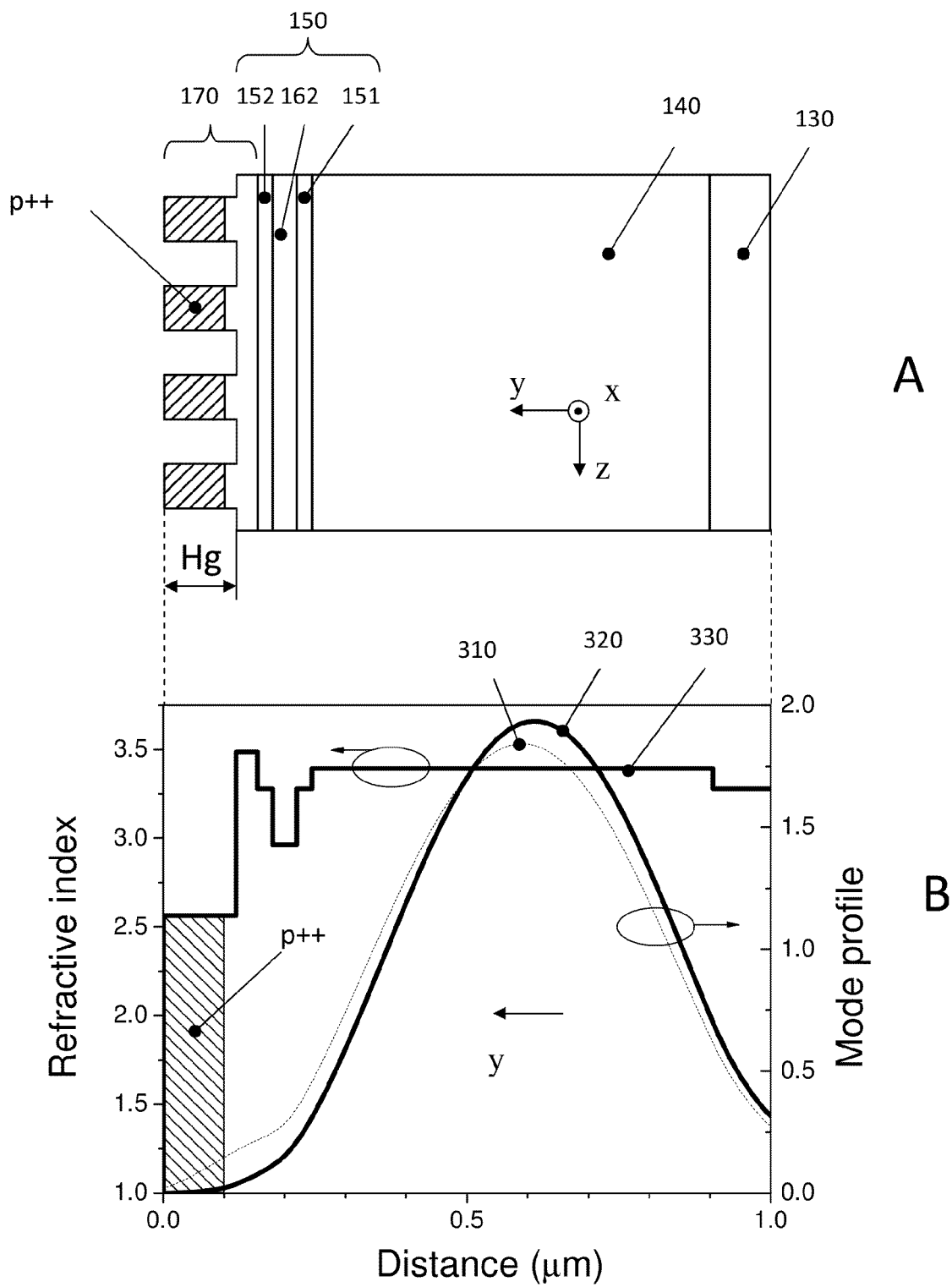
FIG. 3A shows a part of the transverse-longitudinal cross-section of the distributed feedback laser shown in FIG. 1.
FIG. 3B shows the corresponding refractive index profile of FIG. 3A with the calculated transverse mode profile.

The trade-off can be mitigated using a non-uniform doping profile of the cap layer, and one example of such a profile is illustrated in FIG. 3. FIG. 3A shows a sectional area by the longitudinal-transverse plane (y-z) passing through the middle of the stripe. FIG. 3B shows a graph of the transverse refractive index profile 330 and the corresponding calculated waveguide mode profile 320. In order to model the mode profile, the surface-corrugated cap layer 170 is superimposed by an equivalent layer, which is uniform along the direction z. The refractive index $n_{cap}(y)$ of the of the equivalent layer is a quadratic mean of the cap layer refractive index $n_{cap}(y,z)$ through the grating period $\Lambda$ ($n_{cap}(y)=[1/\Lambda \int_\Lambda n_{cap}^2(y,z)dz]^{1/2}$). The dotted line 310 specifies an original mode of the structure without grating. One can see that the light is pushed out of the cap layer by the distributed Bragg reflector, which is due to the high index contrast between the semiconductor material and the surrounding medium. In other words, there is a fast decay of the optical power from the bottom to the top of the grating tooth. Therefore, the increase in the tooth height and the localization of the highly doped material on the top of the tooth are preferable in order to combine the required coupling factor and low optical loss, while maintaining a high level of sheet conductivity.

Figure 4:
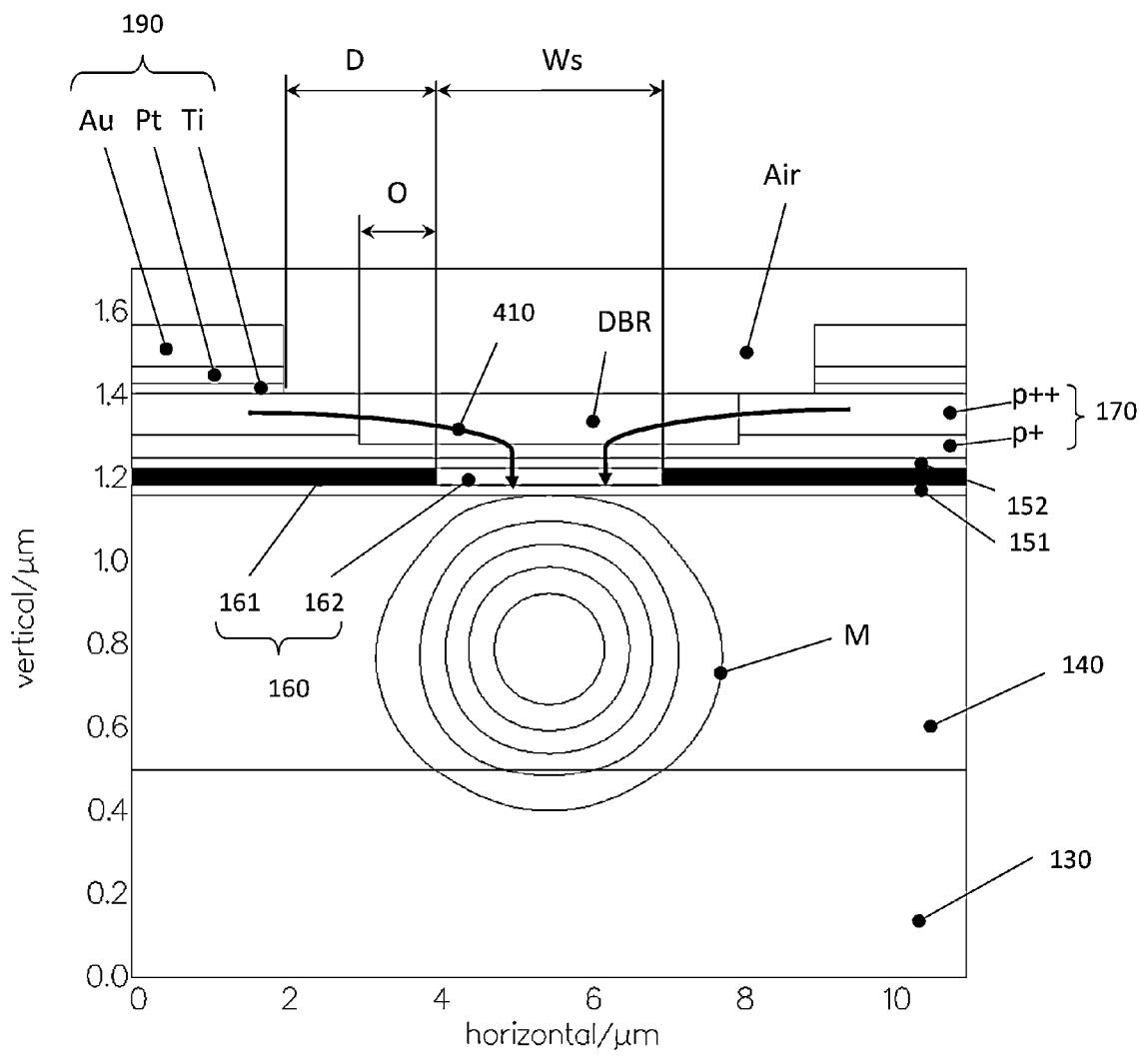
FIG. 4 is a part of a lateral-transverse cross-section of the distributed feedback laser of FIG. 1. The dimensions of one possible design are shown.

FIG. 4 illustrates a cross-section of the distributed feedback laser along a plane (x-y) orthogonal to the longitudinal direction. The illustration corresponds to the first embodiment and to the structure described in Table 1. The lateral waveguide width $W_s$ of the device is selected to be narrow enough for the existence of only one spatial mode, but broad enough to concentrate the light power mostly below the aperture 162, which is limited by the oxidized parts 161 of the Al-rich layer 160. The latter is desirable to provide better overlap of the pumped media with the waveguide mode M, in order to achieve higher coupling efficiency with the distributed Bragg reflector, and to decrease the absorption of the evanescent tails of the waveguide mode by the metal contacts. In some preferred embodiments, the waveguide width $W_s$ is in the range of 2-5 µm. The cap layer 170 includes two parts designated as p++ and p+. The p++ part is highly doped to provide surface conductivity. The doping level of the p+ part is decreased relative to the doping level of p++. In preferred embodiments, the acceptor concentrations in the p++ and p+ parts of the cap layer 170 are preferably selected within the ranges $10^{19}$-$10^{20}$ cm$^{-3}$ and $10^{18}$-$10^{19}$ cm$^{-3}$, respectively. In this particular example, the thickness of p++ and p+ are 100 nm and 55 nm, respectively. In some preferred embodiments the thicknesses of the p++ and p+ layers are selected in the ranges 50-500 nm and 25-250 nm, respectively. A more complex doping profile of the cap layer 170, including but not limited to, multi-step, linear, and exponential profiles, is also possible for more accurate balancing between the grating coupling coefficient and optical losses. The distributed Bragg reflector is etched through the high-doped part p++ into the relatively low-doped part p+. As previously explained, this construction avoids undesirable optical loss, while maintaining the required coupling coefficient and sheet resistance level. The path of carriers from metal contacts into the core layers is schematically shown by curved arrows 410. In order to reduce optical losses due to light absorption by metallic contacts 190, the metal contacts are located at some distance D from the aperture edges. The distance is preferably selected to be large enough so that the optical losses due to light absorption by metal contacts are comparable or less than those in semiconductor, but not too large to avoid unnecessary electrical resistance and heating. In some preferred embodiments the metal edges are offset at a distance of approximately 0.5 to approximately 5 µm from the oxide stripe edges. In this particular example, the metal contacts 190 include three layers: the Ti adhesion layer, the Pt diffusion barrier for gold and the Au highly conductive layer. This non-alloyed ohmic contact is ordinarily utilized for metallization of the p side of III-V lasers. In one particular example using these layers, the thicknesses of the Ti and Pt are preferably 25 nm and 40 nm, respectively. While the Au thickness is not important for optical loss, if the Au layer is too thin, this can result in technical limitations concerning wiring and a higher device resistance. In one preferred embodiment, the thickness of the Au layer is in the range of 100 nm to 10 µm. Alternative metallic systems are also possible to form a p-contact, including, but not limited to, Cr/Au or Zn/Au.

The TE optical modes of the ridge waveguide were simulated by a 2D vector complex mode solver. For the mode profile calculation, the distributed Bragg reflector region is superimposed by the equivalent layer with a thickness equal to the distributed Bragg reflector tooth height Hg and the dielectric permittivity averaged along the light propagation direction. The coupling factor is calculated in correspondence with Coupled-mode theory (see for example A. Yariv, "Coupled-mode theory for guided-wave optics", IEEE J. Quantum Electron. QE-9, 919, 1973). In this particular example, the distributed Bragg reflector tooth height $H_g$=120 nm, the distributed Bragg reflector duty cycle $\zeta$=0.5, the lateral waveguide width $W_s$=3 µm, and the distributed Bragg reflector offset O=1 µm. For the selected parameter values, the simulation shows that the only fundamental mode of the waveguide exists at a wavelength of 1.05 µm. The simulation also shows that the effective waveguide refractive index value is $n_e$=3.353, which corresponds to the Bragg grating period of 156.6 nm, and that the coupling factor value is κ=36 cm$^{-1}$ (which corresponds to the coupling-length product κL=1.8 at the chip length L=500 µm). The calculated spot size is 2.7× 0.50 µm$^2$ (FWHM of the light intensity profile) and the output beam divergence is 6.8°×53° FWHM. The waveguide loss depends on the cap layer doping level and the metal contact location with respect to the waveguide mode. In this particular example, the distance between the metal contact and the oxide aperture edges is D=2 µm, and the loss in the cap layer parts p++ and p+ are assumed to be 500 cm$^{-1}$ and 50 cm$^{-1}$, respectively. The simulation predicts that the summary losses produced by the metal and cap layer absorption do not exceed 0.7 cm$^{-1}$. Being considerably less than the radiation losses, the summary losses cannot significantly affect the distributed feedback laser performance.

Figure 5:
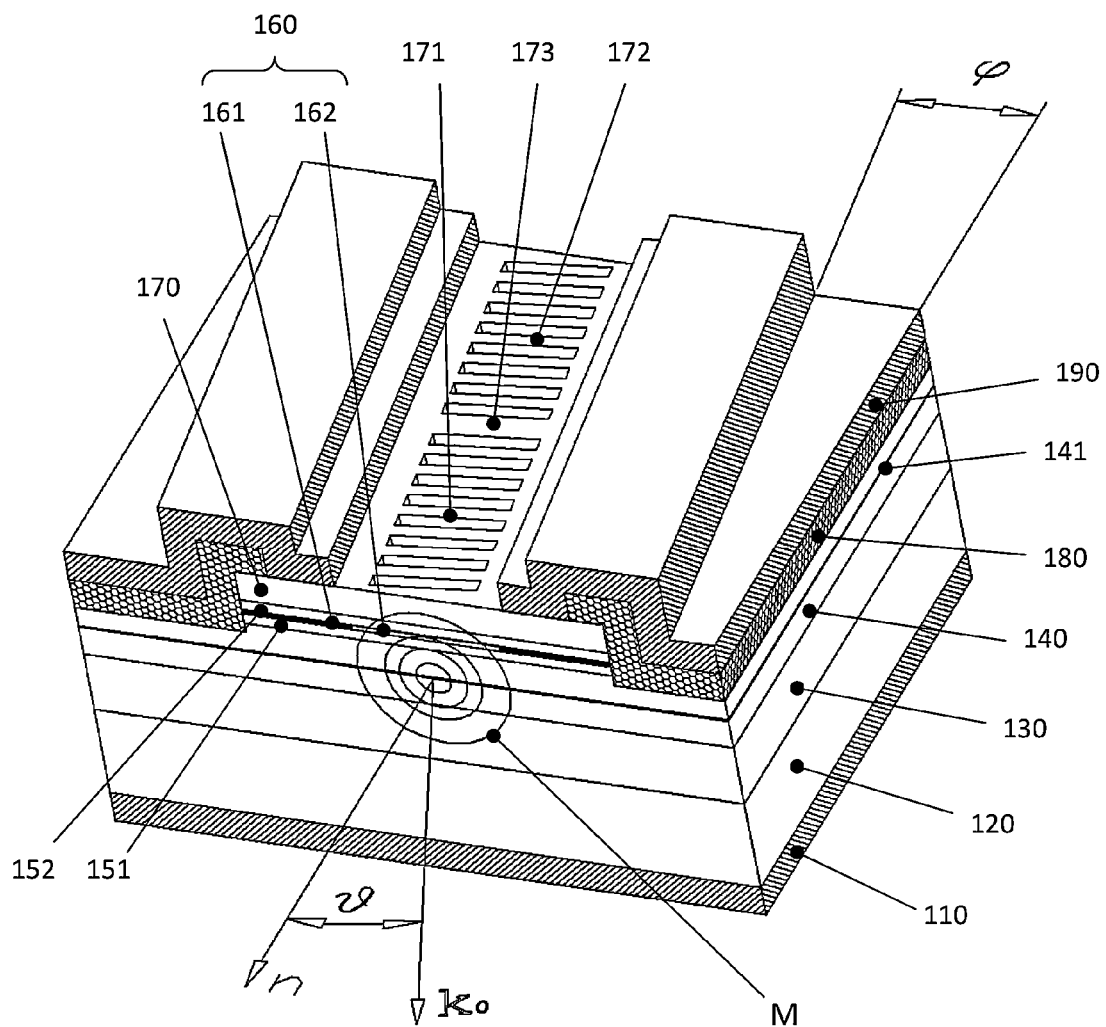
FIG. 5 is a schematic perspective view of a second embodiment of the distributed feedback laser having a tilted stripe.

The reflectivity associated with the facets adversely affects distributed feedback lasers. Therefore, additional measures are desirable to minimize such parasitic reflections. One approach is illustrated in FIG. 5, which schematically shows a second embodiment of a distributed feedback laser according to the present invention. In contrast to the first embodiment, the ridge is tilted by an angle φ≠0 with respect to normal n to the laser facet. The distributed Bragg reflector teeth are also tilted by the same angle φ so that they stay orthogonal to the light propagation direction. The other components of the device are the same as the components shown and described with respect to FIG. 1. The average wave vector $k_0$ of the output radiation is tilted by an angle θ, which can be estimated by using Snell's law: Sin[θ]=$n_e$ Sin[φ], where $n_e$ is an effective refractive index of the waveguide. A reasonable ridge tilt angle is fundamentally limited by the effect of the total internal reflection. However, since it is not easy to employ a chip having a highly tilted output beam, practically useful values of φ do not exceed 10°. The design provides a high degree of side modes suppression (SMSR) by excluding parasitic Fabri-Perot modes. It also essentially relaxes tolerances for the facet anti-reflecting (AR) coatings, thereby reducing the cost and increasing the yield while keeping the same criteria of the laser performance. When the tilt angle φ value is large enough, the distributed feedback laser can operate properly even without AR coating, which simplifies the development loops and also simplifies the intermediate quality control.

Figure 6:
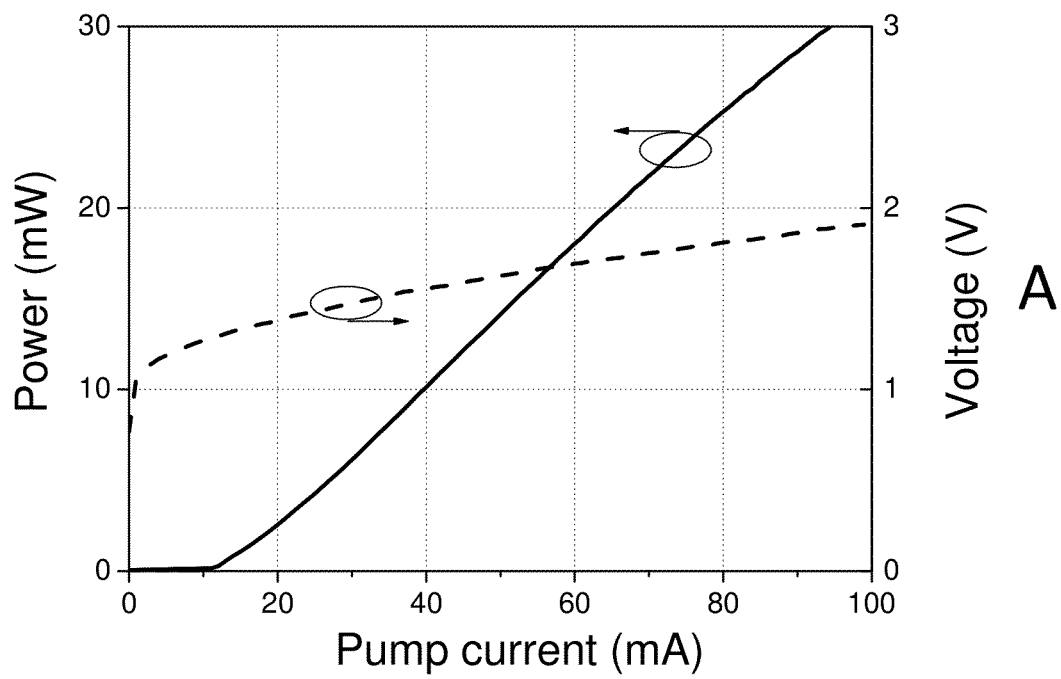
FIG. 6A depicts experimental voltage-current and light-current characteristics for the laser processed in correspondence with the second embodiment illustrated in FIG. 5.
FIG. 6B depicts the spectra of radiation at different pumping levels for the laser processed in correspondence with the second embodiment illustrated in FIG. 5.
Figure 6:
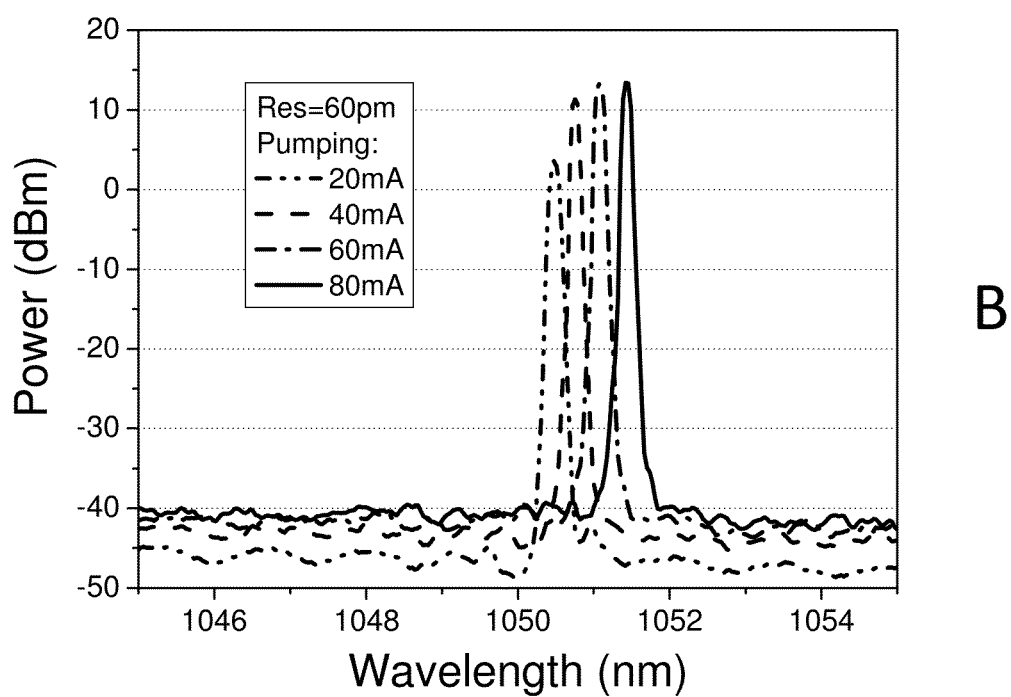

The experimental samples of the distributed feedback lasers were manufactured and tested. One sample design corresponds to the second distributed feedback laser embodiment shown in FIG. 5, which is most suitable for the development process. The samples have the same cross-sectional structure as illustrated in FIG. 4. The core structure of the metallic beam epitaxy grown structure includes a single quantum well, which is designed for lasing at a wavelength of 1.05 µm. The first order distributed Bragg reflector is manufactured using e-beam lithography. A ridge of 13 µm-width is tilted by an angle φ=5°. A 3 µm-width stripe in the middle of the ridge is formed by selective oxidation of the Al-rich layer. The chip of 500 μm-length includes two equal distributed Bragg reflector sections with the λ/4 phase shift between of them. Both facets are AR-coated. Each sample is bonded p-side-up on an MN carrier, then wired so that all p-side contact pads are connected in parallel. The devices are tested at a fixed carrier temperature under DC pumping current and demonstrate light generation in a single spatial mode with a beam divergence close to the theoretically calculated value. They operate in a single-frequency regime over a broad current range between approximately 20 mA and 90 mA without mode-hopping. A power of more than 25 mW per facet with a side mode suppression ratio (SMSR) of more 50 dB is achieved. The threshold current of the device is typically less than 15 mA and the slope efficiency is higher than 0.3 W/A per facet. The forward voltage is less than 2V. FIG. 6 shows a typical optical spectra measured at different pumping current values and corresponding light- and voltage-current characteristics. FIG. 6A shows the power and the voltage versus pump current. For example, when the pump current is 40 mA, the power is approximately 10 mW and the voltage is approximately 1.6V. FIG. 6B shows optical power spectra for different pump currents: 20 mA, 40 mA, 60 mA, and 80 mA. The measured parameters are comparable to or better than those of other distributed feedback laser types and can be improved by further design optimization.

Figure 7:
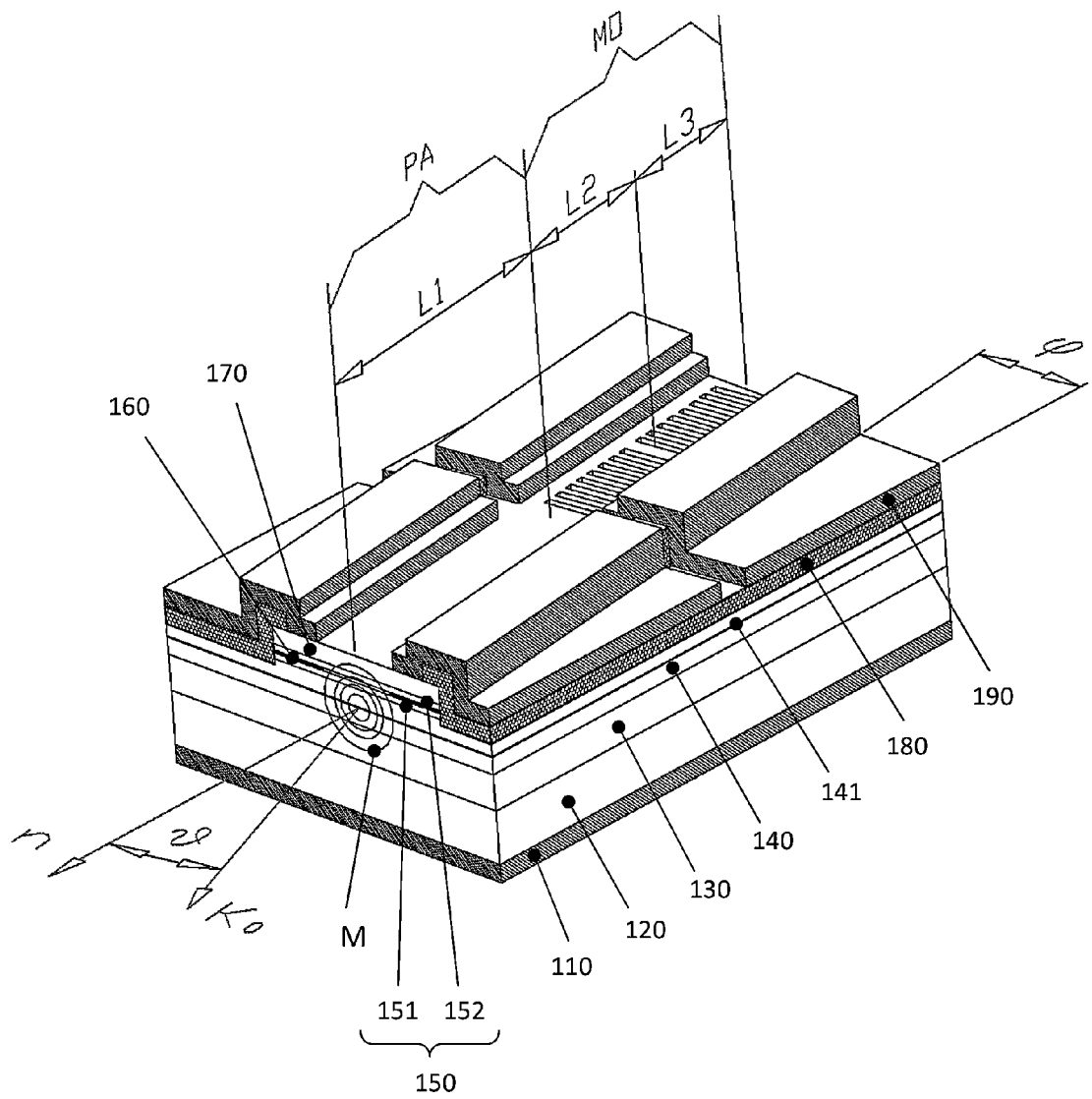
FIG. 7 is a schematic perspective view of a master-oscillator power-amplifier (MOPA) distributed feedback laser having a tilted stripe, a master oscillator (MO) and an integrated optical power amplifier (PA) corresponding to the third embodiment.

A third embodiment in accordance with the present invention is illustrated in FIG. 7. The device represents a monolithic master-oscillator power-amplifier laser, which includes a distributed feedback master oscillator (MO) and a monolithically integrated optical power amplifier (PA). The MO structure includes similar components as the components described with respect to the laser of FIGS. 1 and 5. This construction permits an increase in the emitted light power as compared to the distributed feedback lasers in the first and second embodiments. Another advantage is in the redistribution of the light to the front facet even though the master oscillator is designed symmetrically. The parasitic light reflected from the front facet of the master-oscillator power-amplifier is additionally gained before reaching the master oscillator. Therefore, the master-oscillator power-amplifier is more sensitive to such a reflection than the distributed feedback laser itself. The tilted waveguide geometry allows considerable reduction of the back reflections. Thus, taking into account that the manufacturing of the required anti-reflection coating is a challenging technical task, using a tilted geometry is advantageous and preferable.

The tilt angle φ is preferably selected within the range from 5° to 10°. Nevertheless, smaller values down to 0° are still possible when the amplifier gain is low and the AR coating is deep. The acceptable level of AR coating is defined by the product of the single-pass power amplifier gain $G_{PA}$ square to the back reflection from the front surface $R_F$. The product has to be less than $10^{-3}$ ($G_{PA}^2 R_F < 10^{-3}$) in order to provide high yield and stable operation of the distributed feedback master-oscillator. For example, if the power reflection $R_F$ from the front AR coated surface is as low as $10^{-4}$ and the maximum power-amplifier gain $G_{PA}$ is as small as 3, the direct stripe construction is reasonable. In this example, the master-oscillator power-amplifier is designed so that the master oscillator and the power amplifier metal contacts are divided from each other. This allows separate pumping of each section, thereby providing an additional degree of freedom for lasing regime optimization, and further helps in the development process. In other words, a complex, time consuming, and expensive technological operation (AR coating) that adds uncertainties to the process can be excluded from the laser development and optimization process. This may be important, especially for low-volume production to decrease the development cost and time. In general, the sections can have a common contact as well.

The length of the master oscillator distributed Bragg reflector sections L2 and L3 are selected so that the high power and the single-frequency generation are reached. On one hand, they have to be small for possibly larger spectral separation between the longitudinal modes of the master oscillator. This helps to minimize the negative effects of technological inhomogeneities, the temperature gradient, and the spatial hole burning. On the other hand, a longer master oscillator is needed to inject as high power as possible into the amplifier section. A more powerful master oscillator and a correspondingly shorter amplifier are preferable to minimize the level of the amplified spontaneous emission (ASE) in the output radiation as well as to decrease the sensitivity to the parasitic feedback. Depending on the application, the practically useful length of the master oscillator L2+L3 is preferably selected between 200 μm and 2 mm. The length of the amplifier section L1 has to be large enough to reach a required power of emitted light, but not too large to avoid unnecessary power efficiency drop. The length of the amplifier section is preferably selected within the range from 500 μm to 5 mm. Note the overlap of the optical mode with the cap layer in the amplifier section is considerably larger compared to that of the master oscillator section. It can be easily understood from FIG. 3, where the mode profile 320 of the waveguide with the distributed Bragg reflector is shown by a continuous line, and the mode profile 310 of the same waveguide without distributed Bragg reflection is shown by a dotted line. Therefore, the structure for the distributed feedback master-oscillator power-amplifier must be more carefully designed compared to that for a simple distributed feedback laser structure in terms of the optical loss generated by the cap layer.

Figure 8:
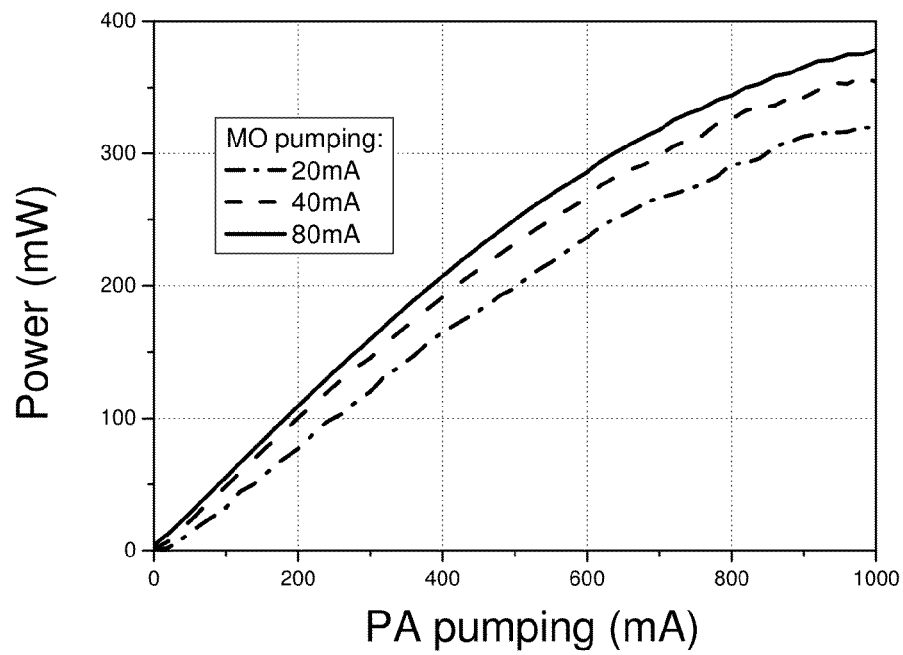
FIG. 8A depicts the experimentally measured light-current characteristics for the master-oscillator (MO) power-amplifier (PA) distributed feedback laser processed in correspondence with the third embodiment illustrated in FIG. 7.
FIG. 8B depicts the spectra of radiation at different pumping levels of the power amplifier section for the laser processed in correspondence with the third embodiment illustrated in FIG. 7.
Figure 8:
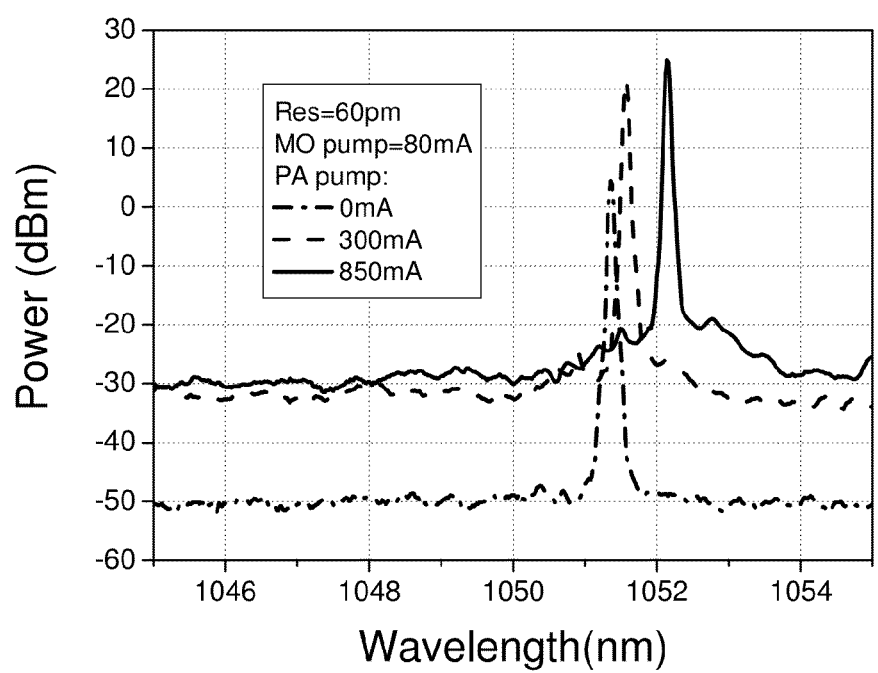

FIG. 8 shows the characteristics of one distributed feedback master-oscillator power-amplifier laser, which has been manufactured in correspondence with the third embodiment described above. These lasers have the same cross-sectional structure as illustrated in FIG. 4. The core layers of the molecular beam epitaxy grown structure include a single quantum well, which is designed for lasing at the wavelength of 1.05 μm. The first order distributed Bragg reflector is manufactured using e-beam lithography. The ridge of 13 μm-width is tilted by an angle φ=5°. A 3 μm-width stripe in the middle of the ridge is formed by selective oxidation of the Al-rich layer. This particular sample has a distributed feedback master oscillator section with a length of 500 μm and a power amplifier section with a length of 2.5 mm. The amplifier and the master oscillator sections are pumped independently. The dependencies of the emitting light power on the amplifier section current, which are measured at the temperature of 25° C. for a few values of the distributed feedback master oscillator pump current, are shown in FIG. 8A. The emitting light power reaches 350 mW, which is of an order of magnitude higher compared to the maximal power of a distributed feedback laser without an amplifier section. Although the output light power only slightly depends on the power injected into the amplifier section, a high power generated by the master oscillator is preferable for keeping the amplified spontaneous emission (ASE) level as low as possible. Output power is saturated, and therefore, slightly depends on the input signal. Nevertheless the higher power of the input signal is desirable to minimize ASE and the sensitivity to the optical feedback. FIG. 8B shows the emitting light spectra at fixed pumping of the master oscillator of 80 mA and the current through the amplifier varied within the range from 0 to 850 mA. Single-frequency operation with a side mode suppression ratio of more than 40 dB is observed through the whole range. In FIG. 6A, the pumping current flows through the distributed feedback laser. In FIG. 8A, the pumping current flows through the power amplifier (PA).

Figure 9:
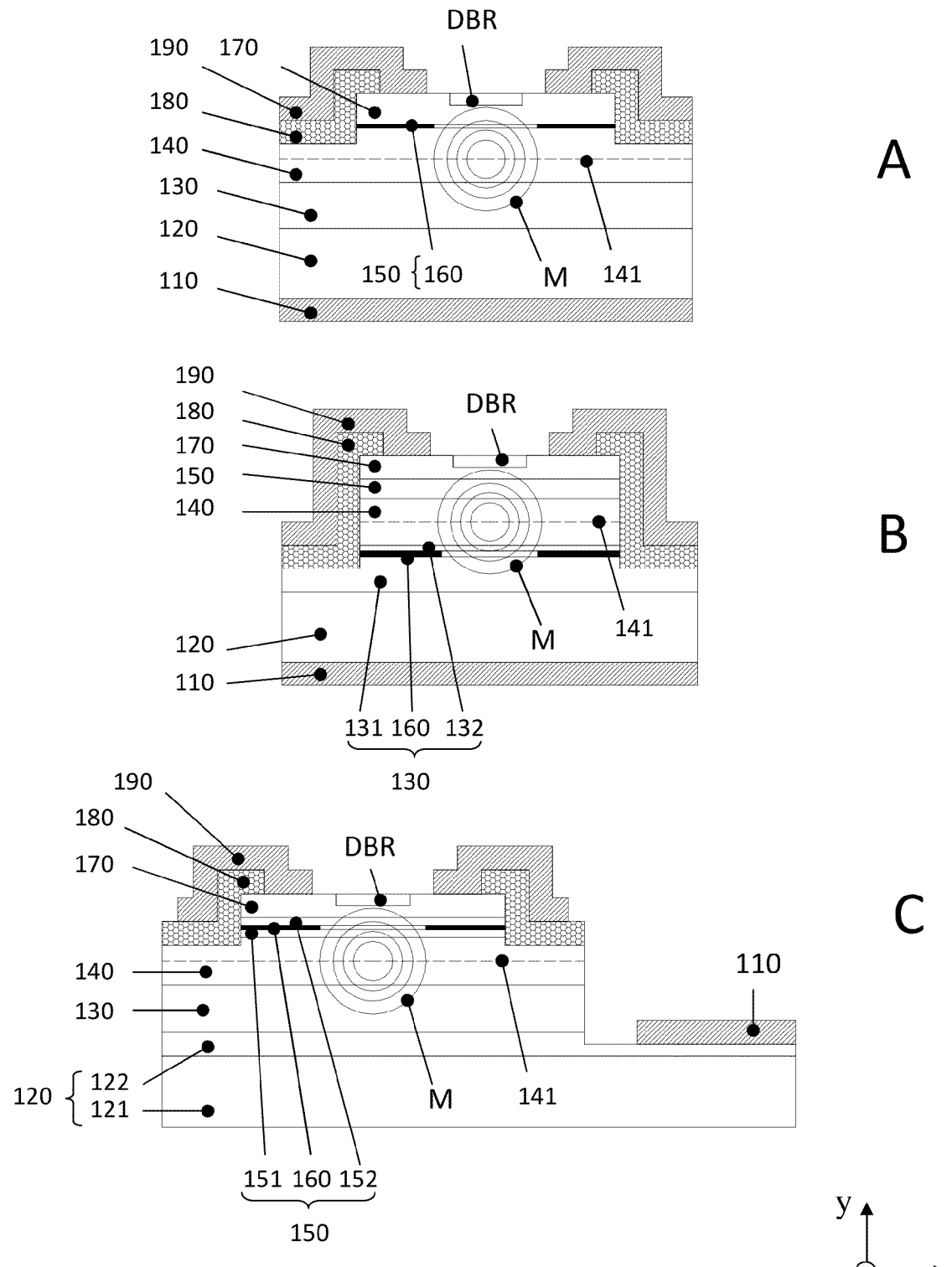
FIG. 9A is an illustration of the lateral-transverse cross-section for a design variation of the distributed feedback laser, where only the Al-rich layer is presented in the upper cladding.
FIG. 9B is an illustration of the lateral-transverse cross-section for some design variations of the distributed feedback laser, with the Al-rich layer, which is placed below the core region.
FIG. 9C is an illustration of the lateral-transverse cross-section for some design variations of the distributed feedback, where both p and n contacts are formed on the same side of the structure.

Some other variations of the distributed feedback lasers described herein are schematically shown in FIG. 9, which demonstrates cross-sectional views orthogonal to the longitudinal direction (x-y plane). FIG. 9A illustrates the distributed feedback laser without the spacers 151, 152 of the upper cladding structure 150. For example, this construction can be selected for increasing coupling between the light and the distributed Bragg reflector.

FIG. 9B illustrates a distributed feedback laser with an Al-rich layer, which is placed below the core structure 140. The Al-rich layer is preferably placed between two spacer layers 131, 132 of a p-doped cladding structure 130. The preferable conductivity type of the cladding structure has to provide minimal level of charge carrier spreading in the active layer 141 in the lateral direction. Therefore, in contrast to the previous examples, the lower cladding structure 130 and the Al-rich layer 160 are doped by acceptors, and the upper cladding structure 150 and the cap layer 170 are correspondingly doped by donors. Such an inverted structure is preferably grown on a p-doped substrate. Since the optical absorption of the n-type layer is considerably less than that of a p-type layer of the same specific conductivity, the distributed feedback laser internal loss caused by the n-type top cap layer 170 can be much less compared to the p-type counterpart. Therefore, the electrical resistance of the distributed feedback laser can be reduced without essential growth of the internal optical loss simply by using higher doping concentrations of the top cap layer 170 and the upper cladding layer 150. The low-loss cap layer 170 is especially important for the distributed feedback master-oscillator power-amplifier lasers, in which the internal loss is increased by enlarging the overlap of the waveguide mode with the cap layer in the power amplifier section, and by a longer chip as compared to a distributed feedback laser without an amplifier.

FIG. 9C illustrates the distributed feedback laser, where both p and n metal contacts are placed from one side of the structure. In this particular embodiment, the substrate 120 includes two layers. The first layer 121 is a thick semi-insulating layer. The second layer 122 is a highly doped layer, which is used for creation of low-resistive ohmic contact to the metal contact pad 110 as well as for effective lateral current spreading. In some embodiments single-layer highly doped substrate can be also used instead of illustrated two-layer substrate.

One of the advantages of this construction is the possibility to form the distributed Bragg reflector on the final step of wafer processing, which minimizes the grating contaminations and defects. Other constructions would require at least a few steps after the distributed Bragg reflector has been formed, such as bottom metallization and annealing.

Similar to other distributed feedback lasers, the grating design of the lasers according to the present invention can be varied in order to reach the required device functionality. For example, instead of one $\lambda/4$ shift in the chip center, one can use two $\lambda/8$ shifts. As a result, a more uniform longitudinal light distribution is achieved; thereby the detrimental spatial hole burning is suppressed. A larger number of the phase shifts, sampled gratings, or other variations can also be used for further improvement of laser characteristics.

While the embodiments disclosed herein are most suitable for distributed feedback lasers, they are not limited to them. Particularly, a distributed Bragg reflector laser can be easily constructed using the same principles. In addition or instead of the distributed Bragg reflector and the amplifier sections, which were considered in the examples of the embodiments described above, the device can also or alternatively include other sections including, but not limited to, a phase control section and/or a saturable absorber section. Different lateral waveguide shapes, including, but not limited to, curved or tapered elements, are also possible.

In some preferred alternative embodiments, the laser can include at least one high order distributed Bragg reflector, where the lasing wavelength is within the stop-band surrounding a high order Bragg wavelength of the distributed Bragg reflector. The Bragg wavelength of the order m ($\lambda_{B,m}$) obeys the following equation $2\Lambda n_e = m\lambda_{B,m}$, where $\Lambda$ is the grating period and $n_e$ is an effective refractive index of the mode M at the wavelength $\lambda_{B,m}$. In contrast to the first order distributed Bragg reflector, the high order distributed Bragg reflector operates not only as a back reflector, but also as a resonance coupler between the laser waveguide modes and some irradiative modes. For example, the second order distributed Bragg reflector also provides light outcoupling in up and down directions, which correspond to the diffraction orders m=±1. Another laser variation can include an off-resonance grating, where the lasing wavelength is out of all grating stop-bands. Such a grating provides the light outcoupling without any back reflection. For example, it can happen if the $\Lambda$ is selected in such a way that the net gain is negative for each of the Bragg wavelengths $\lambda_{B,m}$.

All patent and nonpatent references discussed herein are herein incorporated by reference.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A semiconductor laser diode comprising:
   a) a multilayer semiconductor structure on an Al-containing material system selected from the group consisting of an AlGaAs/GaAs material system and an AlGaAsSb/GaSb material system, comprising:
      i) a substrate;
      ii) at least one lower cladding layer and at least one upper cladding layer having opposite conductivity types and being disposed above the substrate;
      iii) at least one core layer disposed between the upper cladding layer and the lower cladding layer, wherein a refractive index of the core layer is larger than a refractive index of the lower cladding layer and the upper cladding layer to provide a transverse optical confinement;
      iv) at least one Al-rich layer with an aluminum composition greater than or equal to 80% embedded into at least one of the lower cladding layer and the upper cladding layer; and
      v) a highly doped cap layer disposed above the lower cladding layer, and having a conductivity type that is the same as the conductivity type of the upper cladding layer; and
   b) a ridge comprising a top surface and side walls, wherein the ridge is formed in the multilayer semiconductor structure, and the ridge comprises:
      i) the cap layer;
      ii) at least a part of the upper cladding layer;

iii) the at least one Al-rich layer, which is partially oxidized from the side walls of the ridge to provide a lateral optical confinement and form an aperture for carrier flow;

iv) at least one metal contact disposed on a part of the top surface of the ridge, the metal contact being distanced in a lateral direction from an optical waveguide mode to reduce optical losses; and v) a surface-corrugated grating formed on the top surface of the ridge above an optical waveguide mode.

2. The laser of claim 1, wherein the surface-corrugated grating is a distributed Bragg reflector that provides coupling between counter-propagating optical waves of the laser.

3. The laser of claim 2, wherein the distributed Bragg reflector fills an entire laser cavity, such that the laser is a distributed feedback laser.

4. The laser of claim 2, further comprising two or more distributed Bragg reflector sections with phase shifts between the two or more distributed Bragg reflector sections, in order to favor stable single-frequency lasing.

5. The laser of claim 4, further comprising two distributed Bragg reflector sections with a λ/4 phase shift between the two distributed Bragg reflector sections.

6. The laser of claim 4, further comprising three distributed Bragg reflector sections with a λ/8 phase shift between neighboring sections.

7. The laser of claim 2, wherein the distributed Bragg reflector comprises at least one chirped distributed Bragg reflector section.

8. The laser of claim 2, wherein at least one distributed Bragg reflector operates as a laser cavity mirror and at least one section without distributed Bragg reflection is placed within a laser cavity to provide gain, such that the laser is a distributed Bragg reflector laser.

9. The laser of claim 2, wherein at least one section without distributed Bragg reflection is placed out of a laser cavity to amplify output light, such that the laser is a monolithic master-oscillator power-amplifier laser.

10. The laser of claim 2, wherein at least one cleaved facet is covered by an anti-reflection coating.

11. The laser of claim 10, wherein both a back cleaved facet and a front cleaved facet are covered by anti-reflection coatings.

12. The laser of claim 1, wherein the ridge is tilted with respect to normal to a cleaved facet in order to avoid a parasitic back reflection from the surfaces.

13. The laser of claim 1, wherein the laser is fabricated by using a single-step epitaxial process.

14. The laser of claim 1, wherein the upper cladding layer is p-doped.

15. The laser of claim 1, wherein the upper cladding layer is n-doped.

16. The laser of claim 1, wherein at least one Al-rich layer is embedded into the upper cladding layer.

17. The laser of claim 1, wherein at least one Al-rich layer is embedded into the lower cladding layer.

18. The laser of claim 1, wherein the substrate has the same conductivity type as the lower cladding layer.

19. The laser of claim 1, wherein the metal contacts to the p-doped layers and the n-doped layers of the laser are formed from different sides of the epitaxial heterostructure.

20. The laser of claim 1 wherein the metal contacts to the p-doped layers and the n-doped layers of the laser are fabricated from a single side of the epitaxial heterostructure.

21. The laser of claim 20, wherein the substrate is a semi-insulating substrate.

22. The laser of claim 1, wherein the core layer comprises at least one bulk active layer.

23. The laser of claim 1, wherein the core layer comprises an active medium including one or more quantum confined layers, wherein the quantum confined layers are selected from the group consisting of quantum wells, quantum wires, quantum dots and any combination of quantum wells, quantum wires, and quantum dots.

24. The laser of claim 23, wherein the core layer comprises at least one layer of quantum dots in a quantum well.

25. The laser of claim 2, wherein the distributed Bragg reflector comprises a plurality of teeth, wherein a shape of the teeth is selected from the group consisting of: a rectangular shape, a triangular shape, and a trapezoidal shape.

26. The laser of claim 2, wherein the distributed Bragg reflector is a high-order distributed Bragg reflector, which provides coupling between counter-propagating optical waves via high order diffraction.

27. The laser of claim 26, wherein the high-order distributed Bragg reflector is configured for effective surface light emission.

28. The laser of claim 26, wherein the high-order distributed Bragg reflector is configured to eliminate longitudinal mode degeneracy.

29. The laser of claim 1, wherein the surface-corrugated grating comprises an off-resonance distributed Bragg reflector that provides radiation out-coupling without reflection into a counter-propagating mode.

30. The laser of claim 29, wherein an active medium gain is negative for light of all wavelengths, which are within the stop bands of the distributed Bragg reflector.

31. The laser of claim 1, wherein the cap layer has a non-uniform doping profile, such that material with a higher doping level is placed closer to a surface of the cap layer.

32. A semiconductor laser diode comprising:
a) a multilayer semiconductor structure comprising:
i) a substrate;
ii) at least one lower cladding layer and at least one upper cladding layer having opposite conductivity types and being disposed above the substrate;
iii) at least one core layer disposed between the upper cladding layer and the lower cladding layer, wherein a refractive index of the core layer is larger than a refractive index of the lower cladding layer and the upper cladding layer to provide a transverse optical confinement;
iv) at least one Al-rich layer embedded into at least one of the lower cladding layer and the upper cladding layer; and
v) a highly doped cap layer disposed above the lower cladding layer, and having a conductivity type that is the same as the conductivity type of the upper cladding layer; and
b) a ridge comprising a top surface and side walls, wherein the ridge is formed in the multilayer semiconductor structure, and the ridge comprises:
i) the cap layer;
ii) at least a part of the upper cladding layer;
iii) the at least one Al-rich layer, which is partially oxidized from the side walls of the ridge to provide a lateral optical confinement and form an aperture for carrier flow;
iv) at least one metal contact disposed on a part of the top surface of the ridge, the metal contact being distanced in a lateral direction from an optical waveguide mode to reduce optical losses; and v) a distributed Bragg reflector formed on the top surface of the ridge above an optical waveguide mode and comprising three distributed Bragg reflector sections with a $\lambda/8$ phase shift between neighboring sections, wherein the distributed Bragg reflector provides coupling between counter-propagating optical waves of the laser.

* * * * *